United States Patent [19]

Rausch et al.

[11] Patent Number: 5,963,600
[45] Date of Patent: *Oct. 5, 1999

[54] MICRO-CONTROLLER BASED FREQUENCY CALIBRATION

[75] Inventors: Kris Rausch, Greensboro, N.C.; Michael James Trainor; Louis R. DiFrancisco, both of Palatine, Ill.

[73] Assignee: Northrop Grumman Corporation, Los Angeles, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/811,819

[22] Filed: Mar. 4, 1997

[51] Int. Cl.⁶ .............................. H04L 27/00; H04B 1/38; H04B 1/16
[52] U.S. Cl. .................... 375/344; 375/222; 455/557; 455/205
[58] Field of Search ..................... 375/344, 222, 375/316; 455/557, 205, 255, 257, 260, 264, 265, 192.1, 192.2

[56] References Cited

U.S. PATENT DOCUMENTS

| | | | |
|---|---|---|---|
| 5,020,092 | 5/1991 | Phillips et al. | 379/59 |
| 5,077,834 | 12/1991 | Andros et al. | 455/193.1 |
| 5,115,515 | 5/1992 | Yamamoto et al. | 455/71 |
| 5,193,216 | 3/1993 | Davis | 455/67.7 |
| 5,303,406 | 4/1994 | Hansen et al. | 455/222 |
| 5,487,186 | 1/1996 | Scarpa | 375/344 |
| 5,515,364 | 5/1996 | Fague | 370/278 |
| 5,621,757 | 4/1997 | Hori | 375/344 |
| 5,692,016 | 11/1997 | Vanselow | 375/344 |
| 5,805,984 | 9/1998 | Tangen | 455/71 |

*Primary Examiner*—Chi H. Pham
*Assistant Examiner*—Khai Tran
*Attorney, Agent, or Firm*—Terry J. Anderson; Karl J. Hoch, Jr.

[57] ABSTRACT

A radio modem is disclosed that includes a radio receiver for receiving radio signals comprising data frequency multiplexed onto a carrier signal having a carrier frequency. An oscillator generates a reference frequency for an FM discriminator, which is connected to the antenna and to the for demodulating said data from said radio signals using said reference frequency. A microprocessor has an input connected to the output of the FM discriminator. The microprocessor also has an output. The microprocessor is programmed to sample the signal voltage output by the FM discriminator, average the signal voltage samples, and compare the average to a preset voltage. The microprocessor is programmed so that if the average differs from the preset voltage, the microprocessor generates an error signal at the microprocessor output. The oscillator is coupled to the microprocessor output so that the error signal adjusts the frequency of the oscillator.

9 Claims, 1 Drawing Sheet

MICRO-CONTROLLER BASED FREQUENCY CALIBRATION

BACKGROUND OF THE INVENTION

The present invention relates to modems, and particularly to packet data radio modems, and the radio communication systems incorporating such modems. In further particularity, the present invention pertains to ensuring that the frequency at the receiving modem matches the carrier frequency of the transmitting modem.

Modems modulate digital data onto analog carrier signals for transmission over analog communication channels, and demodulate received signals to recover the digital data. The analog communication channel may be a conventional wired telephone system, or it may be a wireless radio link.

The modes of modulating the data onto the carrier signal in radio communication links may be different than the modes in a wire system. A radio communication link provides a number of complications for a modem using that link to transmit data.

One technique used by modems for use in radio communication systems is to package the data to be transmitted into discrete packets of data. The data packets are frequency modulated onto the carrier signal. The receiving modem recovers the data from the frequency modulated signal.

In a radio communication link such as is used with a packet data radio modem, the carrier signal may not always be present. The periodic lack of a carrier signal may cause the receiving modem to conclude that the communication link has been lost, or to erroneously alter its expectations of the received carrier frequency.

As is well known, the quality of a radio transmission link can vary considerably during a single communication session. The radio transmission link may be substantially less than ideal. When the radio link is poor, the receiving modem may misinterpret the data information contained in the received signal. The rate at which errors are made is called the bit error rate. The bit error rate is affected by such factors as thermal noise, oscillator phase noise, group delay distortion, interfering sources, and frequency errors. The present invention reduces errors due to frequency errors.

The frequency at which the receiving modem is operating must match the frequency of the transmitting modem. In the case of a radio modem, the mobile modem must match that of the fixed base station with which it is communicating. There are events that occur in radio data transmission that may require that the mobile unit recalibrate its operating frequency. For example, as it moves, the mobile unit may switch to a different operating cell, which has a different fixed base unit. The mobile unit should also retain it knowledge of the carrier signal frequency when it loses the radio signal for short periods of time.

Various automatic frequency control techniques for locking the local oscillator of the mobile modem to the same frequency as that of the base station have been proposed. Such techniques include a local oscillator in the mobile unit that is to produce a frequency that matches the frequency of the transmitting station. Circuitry is used to analyze the output of the demodulator and determine if it appears that the carrier signal has been correctly removed from the received signal. However, such techniques generally require extremely accurate (and expensive) components, and careful calibration.

Thus, a low cost, simple arrangement for an automatic frequency control technique for locking the local oscillator of the mobile modem to the same frequency as that of the base station is desired. In addition, a low cost, simple mechanism is desired for maintaining the last known frequency during brief periods when the carrier signal is not present.

SUMMARY OF THE INVENTION

The present invention is a automatic frequency control system for radio modem that uses a microprocessor to generate a feedback signal for adjusting the receiver's frequency so that the receiver's frequency coincides with the carrier frequency of the received signal.

The present invention is a radio modem that includes a radio receiver for receiving radio signals comprising data frequency multiplexed onto a carrier signal having a carrier frequency. An oscillator generates a reference frequency for an FM discriminator, which is connected to the antenna and to the for demodulating said data from said radio signals using said reference frequency. A microprocessor has an input connected to the output of the FM discriminator. The microprocessor also has an output. The microprocessor is programmed to sample the signal voltage output by the FM discriminator, average the signal voltage samples, and compare the average to a preset voltage. The microprocessor is programmed so that if the average differs from the preset voltage, the microprocessor generates an error signal at the microprocessor output. The oscillator is coupled to the microprocessor output so that the error signal adjusts the frequency of the oscillator.

DETAILED DESCRIPTION

The invention will be described in the context of the mobile device in receive mode, receiving data from a transmitting base station.

The described embodiment of present invention is a radio transceiver that includes a single voltage controlled, temperature compensated crystal oscillator (VCTCXO) in a phase locked loop (PLL) frequency synthesizer in both transmit and receive modes.

Figure 1:
FIG. 1 is a block diagram of a radio transmitter and receiver system incorporating the present invention.

A system including a radio communication link appropriate for use with a packet data radio modem is shown conceptually in FIG. 1. A radio transmitter 11 frequency modulates digital data onto a carrier signal. The carrier signal has a carrier frequency. The transmitter uses conventional pseudo-random Gaussian Minimum Shift Keyed (GMSK) modulation. A feature of such pseudo-random GMSK modulation is that, over an extended time, the modulation averages out to the DC voltage of the carrier signal. The transmitter sends the modulated signal from a transmit antenna 13.

The modulated signal is received at a receive antenna 21, and processed by a receiver 23.

Figure 2:
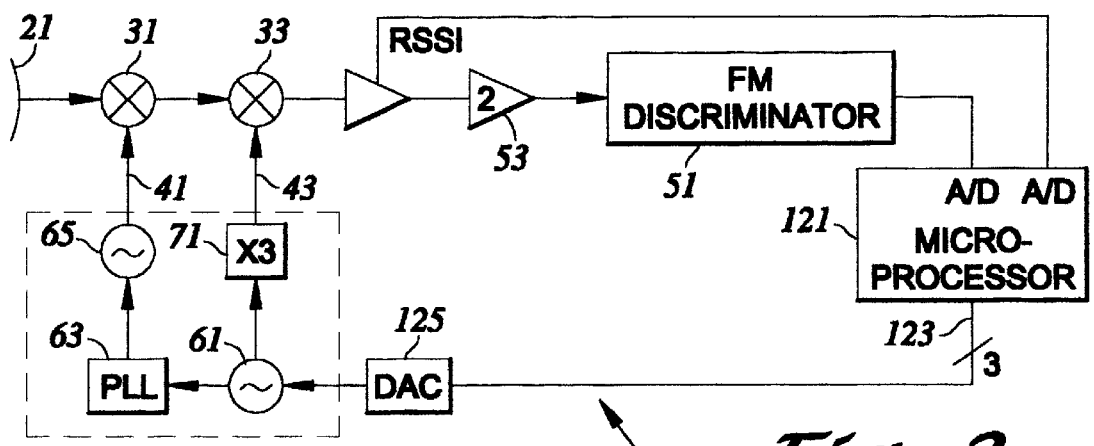
FIG. 2 is a block diagram of a radio transceiver incorporating an embodiment of the present invention for use in a packet data radio modem.

The receiver 23 is shown in FIG. 2. The radio frequency (RF) signal is received at the antenna 21. A mixer 31 mixes the received signal with a first local oscillation signal 41 for a first downconversion to a first intermediate frequency. A second mixer 33 then mixes the signal with a second local oscillation signal 43 for a second downconversion to a second intermediate frequency. An FM demodulator or discriminator 51 then demodulates the signal.

A limiting amplifier 53 ensures a constant amplitude for the signal input to the FM discriminator. The FM demodulator 51 demodulates the data from the carrier signal. If the local oscillator is operating at the same frequency as the oscillator in the transmitter that generates the carrier signal, the output of the FM discriminator will be an analog representation of the data that was modulated onto the carrier signal.

The received frequency modulated RF signal is dual downconverted to an intermediate frequency in a conventional manner. In accordance with the invention, a single reference frequency is used for both downconversions. A crystal oscillator 61 generates the frequency that is the reference for the synthesized local oscillator (the first local oscillation signal 41) for downconversion to the first intermediate frequency. In addition, a harmonic of the crystal oscillator frequency is used as the second local oscillator (the second oscillation signal 43) for downconversion to the second intermediate frequency.

Thus, the receiver may be locked to the received signal by adjusting a single frequency source, the crystal oscillator 61.

An automatic frequency control loop ensures that the local oscillation signals are consistent with the frequency of the carrier frequency of the received radio signal. The automatic frequency control loop includes a single voltage controlled, temperature compensated crystal oscillator (VCTCXO) 61. The VCTCXO is the crystal reference oscillator. The output of the VCTCXO is connected to a phase lock loop (PLL) 63. The output of the PLL is applied to a voltage controlled oscillator 65 to generate the first local oscillation signal 41. The output of the VCTCXO 61 is also applied to a tuned collector amplifier 71 that creates the harmonic of the VCTCXO frequency as the second local oscillation signal 43. The tuned collector amplifier 71 in the illustrated embodiment multiplies the frequency of the VCTCXO 61 by three.

The FM discriminator 51 is a conventional limiter-discriminator type FM demodulator. The FM discriminator includes a Gilbert cell mixer or multiplier.

In accordance with the invention, a digital microprocessor 121 provides the feedback to the automatic frequency control loop 101 and generates the adjustments necessary. The microprocessor 121 is connected to the output of the FM demodulator 51 to receive the received data output. The microprocessor examines the output of the FM demodulator to determine if the local oscillation frequencies are consistent with the carrier frequency of the received signal. If the microprocessor determines that the local oscillation frequencies are not appropriate, the microprocessor produces an error signal to the automatic frequency control loop. That error signal is used to adjust the frequency of the crystal oscillator VCTCXO 61.

The microprocessor 121 may be any conventional microprocessor. Ideally, the microprocessor is the controller microprocessor of the modem. The controller microprocessor controls other radio functions, such as tuning, power management, and timing. By using the controller microprocessor that is already present in the modem, the invention simplifies the modem construction.

The microprocessor uses an analog to digital converter to sample the data produced by the FM discriminator. The input to the analog to digital converter of the microprocessor is connected to the output of the FM discriminator. The analog to digital converter may be internal to the microprocessor.

As mentioned above, over a substantial period of time, the modulation averages out to the carrier DC voltage. The DC voltage, or offset, at which the receiver is locked is preset and known. If the carrier frequency of the received signal differs from the receiver's lock frequency, the DC offset produced by the output of the FM discriminator will be proportionately higher or lower than the set value.

The microprocessor is programmed with a software equivalent of a low-pass filter. This software low pass filter averages the data signal from the FM discriminator. By averaging a large number of samples of the output of the FM discriminator, the microprocessor determines the DC voltage or offset of the FM discriminator output.

The difference between the known DC offset and the average of the samples of the output of the FM discriminator is used to generate an error signal. The error signal is used to adjust the frequency of the crystal oscillator.

By comparing the DC voltage of the FM discriminator output with the set (and expected) DC voltage, the microprocessor determines the amount that the frequency of the local oscillator should be changed so that the local oscillator frequency matches the carrier frequency of the received signal. The microprocessor produces at an output pin 123 an error signal corresponding to the needed frequency change.

That error signal is a digital representation of the voltage that should be applied to the voltage control port of the voltage controlled crystal oscillator 61 to adjust the frequency of the oscillator 61 to correct the frequencies of the first and second oscillation signals 41, 43. That digital signal may be a three bit value. The digital signal is converted to an analog error correction voltage using a digital to analog converter (DAC) 125. The analog voltage from the DAC 125 is applied to the voltage control port of the crystal oscillator 61. The calculated error signal adjusts the frequency of the crystal oscillator in small increments.

The microprocessor may generate an incorrect error signal (correction voltage) if it has averaged a statistically inadequate number of samples of the output of the FM discriminator. For example, when a calibration is initially attempted, the system may attempt to set the oscillator voltage before sufficient samples of the output of the FM discriminator have been made. Therefore, an additional check on the calculated correction voltage is made to determine if the calibration calculations have settled on a stable calibration value.

The microprocessor compares the calculated correction voltage to the current correction voltage. If the newly calculated correction voltage and the current correction voltages are equal (within a tolerance), the system concludes that the microprocessor has converged to a stable correction value for the oscillator. The microprocessor then stops calculating a value for the error correction voltage.

If, however, the newly calculated voltage and the current voltage differ significantly, the digital voltage signal is incremented or decremented (as appropriate). The calculation process is then repeated. A maximum number of iterations is set to ensure that the system is not attempting to calibrate to an erroneous or inappropriate signal frequency. In addition, the range of the voltage output is limited to prevent calibration to an off-frequency base station.

The above calibration process is ideally repeated periodically. Periodic repetition assures that the mobile station will track frequency variations that arise due to temperature. In addition, periodic repetition allows the mobile unit to correct itself if it has converged on an incorrect frequency. The calibration process is also repeated whenever the radio modem is switched to a new base station.

In addition, the microprocessor samples the Received Signal Strength Indication (RSSI) in the downconverted signal. The microprocessor may have a second analog to digital converter input for sampling the RSSI. If the RSSI is high enough to indicate that the received signal is strong enough to be used as a reference, the above calibration process is undertaken. A low RSSI indicates that the signal detected is not truly a modulated data signal. By examining for sufficient RSSI strength before undertaking the calibration process, the system avoids unnecessary attempts to calibrate to spurious signals, such as may occur when the transmitting modem is not actually transmitting.

Figure 3:
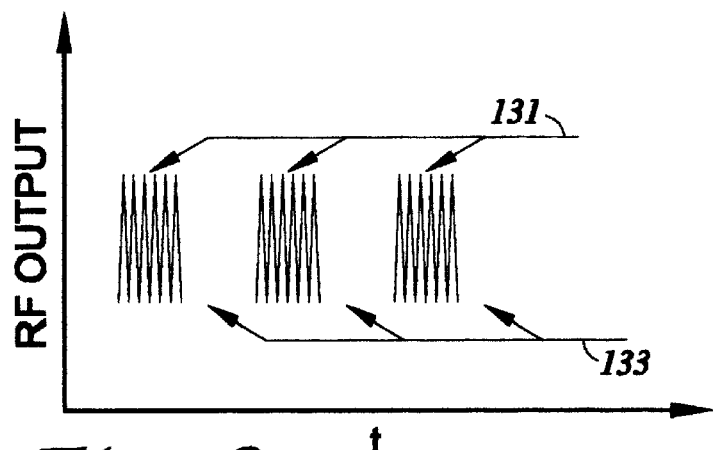
FIG. 3 illustrates a typical packet data radio signal.

The output of the digital error correction voltage from the microprocessor is maintained during periods when the carrier signal drops out so that the lock on the carrier frequency is not lost during carrier off times. The memory capabilities of a digital microprocessor can be used as a sample and hold arrangement to store error parameters when the carrier is off. FIG. 3 illustrates a packet radio RF link, showing that during periods 131 the carrier signal is on and contains data. During periods 133, the carrier signal is off.

The DC voltage that indicates that the modem is frequency locked to the frequency of the carrier signal produced by the base station is stored in the modem's nonvolatile random access memory (RAM). After the calibration process, the voltage signal produced by the microprocessor to the crystal oscillator (calibration value) is also stored in the modem's non-volatile RAM, prior to removing power from the modem. That value is used as the starting value for the first calibration after power is restored to the modem.

When the transceiver is operating in transmit mode, direct modulation of the crystal oscillator is employed.

We claim:

1. A receiver for processing a carrier frequency signal modulated with data from an antenna, the receiver comprising:

1) a mixer in electrical communication with the antenna for mixing the received carrier frequency signal with an initial oscillator signal to thereby generate an intermediate frequency signal;

2) a FM discriminator in electrical communication with the mixer to demodulate the intermediate frequency signal and to generate a DC offset voltage level responsive to the carrier frequency of the received signal;

3) a received signal strength indicator in electrical communication with the mixer, the strength indicator being operative to generate a microprocessor control signal only when the power of the intermediate frequency signal is above a preset threshold;

4) a microprocessor$_{13}$ in electrical communication with the FM discriminator and the received signal strength indicator, the microprocessor being operative to generate an error signal responsive to the difference between the discriminator DC offset voltage level and a preset DC offset voltage level in response to the microprocessor control signal such that only error signal generation is terminated when the power of the intermediate frequency signal is below a preset threshold; and 5) an oscillator in electrical communication with the mixer and the error signal, the oscillator being operative to adjust the frequency of the initial oscillator signal in response to the error signal to thereby generate a successive oscillator signal applied to the mixer and frequency matched to the carrier frequency of the received signal such that the receiver is operative to continuously receive signals.

2. The receiver of claim 1 wherein the mixer comprises first and second mixers.

3. The receiver of claim 1 wherein the preset DC offset voltage level represents a locked operating frequency of the receiver.

4. The receiver of claim 1 wherein the microprocessor samples the discriminator DC offset voltage level and generates an averaged error signal corresponding to a time averaged difference between the discriminator DC offset voltage level and the preset DC offset voltage level.

5. The receiver of claim 1 wherein the microprocessor further comprises nonvolatile RAM for storing the preset DC offset voltage level and the error signal.

6. The receiver of claim 1 wherein the microprocessor terminates error signal generation after the discriminator DC offset voltage level remains substantially constant for a preset period of time.

7. The receiver of claim 1 wherein the microprocessor terminates error signal generation when the microprocessor control signal indicates the power of the intermediate frequency signal is below a preset power threshold.

8. A method of calibrating the frequency of a receiver to match the frequency of a carrier signal received thereby, comprising the steps:

a) receiving the carrier signal modulated by a data signal;

b) mixing the carrier signal with an initial oscillator signal to generate an intermediate frequency signal;

c) demodulating the intermediate signal to generate a discriminator DC offset voltage level responsive to the carrier frequency of the received signal;

d) sampling and averaging the voltage level of the discriminator DC offset voltage;

e) comparing the average voltage level of the discriminator DC offset voltage with a preset DC offset voltage level;

f) generating an error signal in response to the difference between the discriminator DC offset voltage level and the preset DC offset voltage level;

g) applying the error signal to a voltage controlled oscillator to generate a successive oscillator signal frequency matched to the carrier frequency of the received signal;

h) applying the successive oscillator signal to the mixer; and i) comparing the power of the received signal with a threshold power level and terminating the sampling and averaging of the discriminator DC offset voltage by the microprocessor if the power of the received signal is below the threshold power level in order to prevent off-frequency calibration.

9. The method of claim 8 wherein step (e) further comprises:

1) comparing the voltage level of the error signal with a previous value; and 2) terminating the generation of the error signal if the voltage level of a newly computed error signal is substantially equal to the voltage level of a previously computed error signal.

* * * * *